(12) United States Patent
Saito et al.

(10) Patent No.: US 9,340,873 B2
(45) Date of Patent: May 17, 2016

(54) SEMICONDUCTOR DEVICE MANUFACTURING METHOD AND SUBSTRATE PROCESSING APPARATUS

(71) Applicant: HITACHI KOKUSAI ELECTRIC INC., Tokyo (JP)

(72) Inventors: Tatsuyuki Saito, Toyama (JP); Masanori Sakai, Takaoka (JP); Yukinao Kaga, Toyama (JP); Takashi Yokogawa, Tonami (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/680,841

(22) Filed: Apr. 7, 2015

(65) Prior Publication Data

US 2015/0214045 A1    Jul. 30, 2015

Related U.S. Application Data

(60) Division of application No. 13/693,647, filed on Dec. 4, 2012, now abandoned, which is a continuation of application No. PCT/JP2011/062381, filed on May 30, 2011.

(30) Foreign Application Priority Data

Jun. 4, 2010  (JP) ................................. 2010-128417

(51) Int. Cl.
*H01L 21/205* (2006.01)
*C23C 16/44* (2006.01)
(Continued)

(52) U.S. Cl.
CPC ............. *C23C 16/4408* (2013.01); *C23C 16/34* (2013.01); *C23C 16/4412* (2013.01);
(Continued)

(58) Field of Classification Search
CPC ......................... H01L 21/3141; H01L 21/0228
USPC .................................. 438/685, 785; 29/25.01
See application file for complete search history.

(56) References Cited

U.S. PATENT DOCUMENTS 8,633,050 B2 * 1/2014 Pierreux ........................ 438/57
2005/0260348 A1 11/2005 Lee et al.
(Continued)

FOREIGN PATENT DOCUMENTS

JP    07-226380 A    8/1995
JP    2002-367982 A    12/2002
(Continued)

OTHER PUBLICATIONS

Jan. 28, 2015 Decision to Grant Patent issued in Japanese Patent Application No. 2010-128417.
(Continued)

*Primary Examiner* — George Fourson, III
(74) *Attorney, Agent, or Firm* — Oliff PLC

(57) ABSTRACT

Provided is a semiconductor device manufacturing method including: (a) supplying a source gas containing a first element and chlorine to a substrate accommodated in a processing chamber to form an adsorption layer of the source gas on the substrate; (b) supplying a chlorine-containing gas having a composition different from that of the source gas to the substrate while supplying the sources gas before an adsorption of the source gas to the substrate is saturated to suppress the adsorption of the source gas to the substrate; (c) removing the source gas and the chlorine-containing gas remaining on the substrate; (d) supplying a modifying gas including a second element to the substrate to form a layer including the first element and the second element on the substrate by modifying the adsorption layer of the source gas; and (e) removing the modifying gas remaining on the substrate.

16 Claims, 8 Drawing Sheets

(51) Int. Cl.
    *C23C 16/455*     (2006.01)
    *H01L 21/02*     (2006.01)
    *H01L 21/285*     (2006.01)
    *C23C 16/52*     (2006.01)
    *C23C 16/34*     (2006.01)
    *H01L 21/314*     (2006.01)
    *H01L 21/768*     (2006.01)

(52) U.S. Cl.
    CPC ..... *C23C16/45534* (2013.01); *C23C 16/45544* (2013.01); *C23C 16/52* (2013.01); *H01L 21/0228* (2013.01); *H01L 21/02186* (2013.01); *H01L 21/02274* (2013.01); *H01L 21/28562* (2013.01); *H01L 21/3141* (2013.01); *H01L 21/76841* (2013.01)

(56) References Cited

U.S. PATENT DOCUMENTS

| | | | |
|---|---|---|---|
| 2008/0245303 A1 | 10/2008 | Yamamoto | |
| 2009/0253269 A1 | 10/2009 | Tsuneda | |
| 2010/0130024 A1* | 5/2010 | Takasawa et al. | 438/761 |
| 2014/0175355 A1* | 6/2014 | Wang et al. | 257/2 |
| 2014/0175367 A1* | 6/2014 | Tendulkar et al. | 257/4 |

FOREIGN PATENT DOCUMENTS

| | | |
|---|---|---|
| JP | 2004-087707 A | 3/2004 |
| JP | 2006-516809 A | 7/2006 |
| JP | 2006-524434 A | 10/2006 |
| JP | 2008-199052 A | 8/2008 |
| JP | 2008-277777 A | 11/2008 |
| JP | 2009-263764 A | 11/2009 |
| JP | 2010-074172 A | 4/2010 |
| JP | 2011-132589 A | 7/2011 |
| WO | 2007/020874 A1 | 2/2007 |

OTHER PUBLICATIONS

Aug. 30, 2011 International Search Report issued in International Application No. PCT/JP2011/062381.

Sep. 12, 2014 Office Action issued in Japanese Patent Application No. 2010-128417.

* cited by examiner

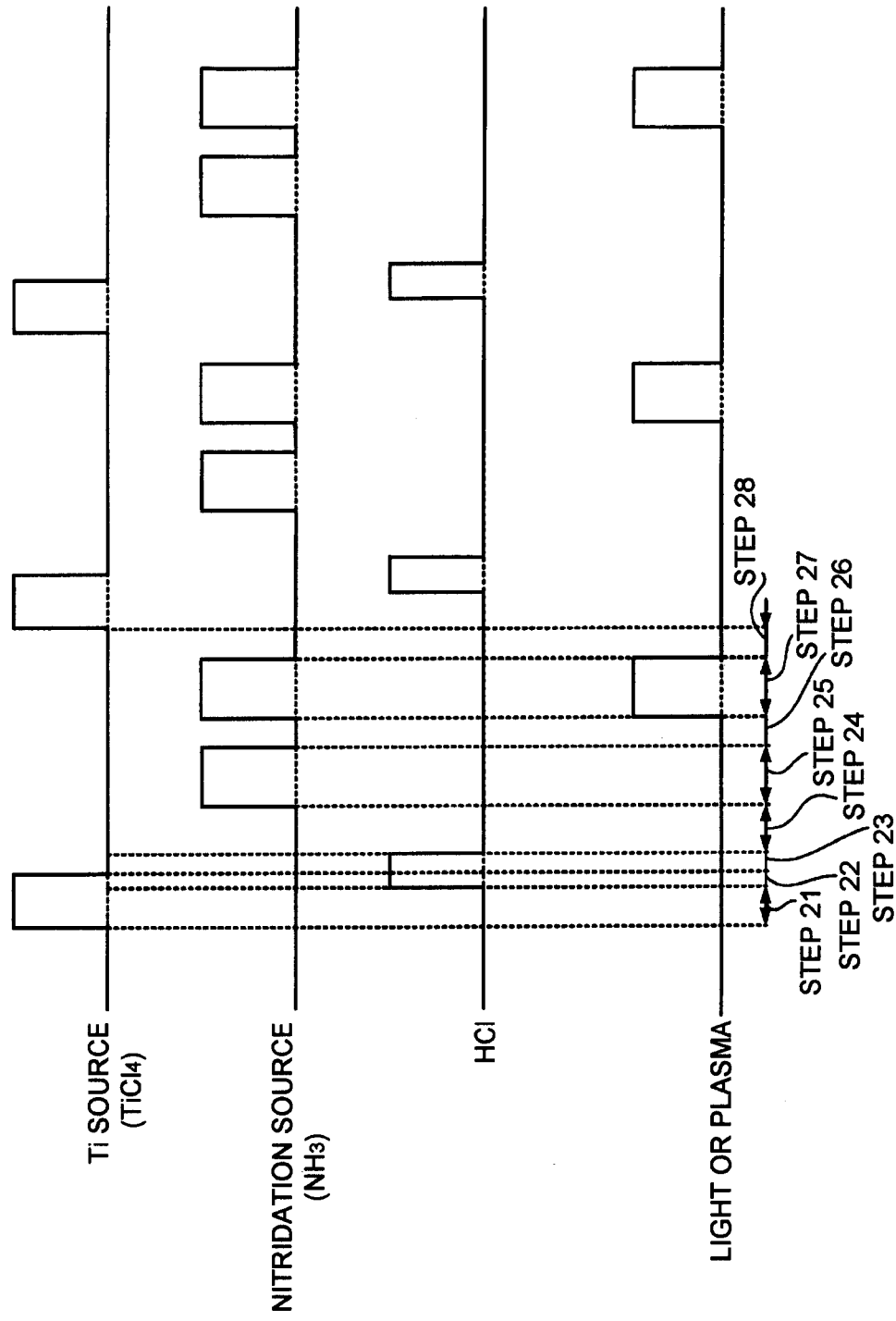

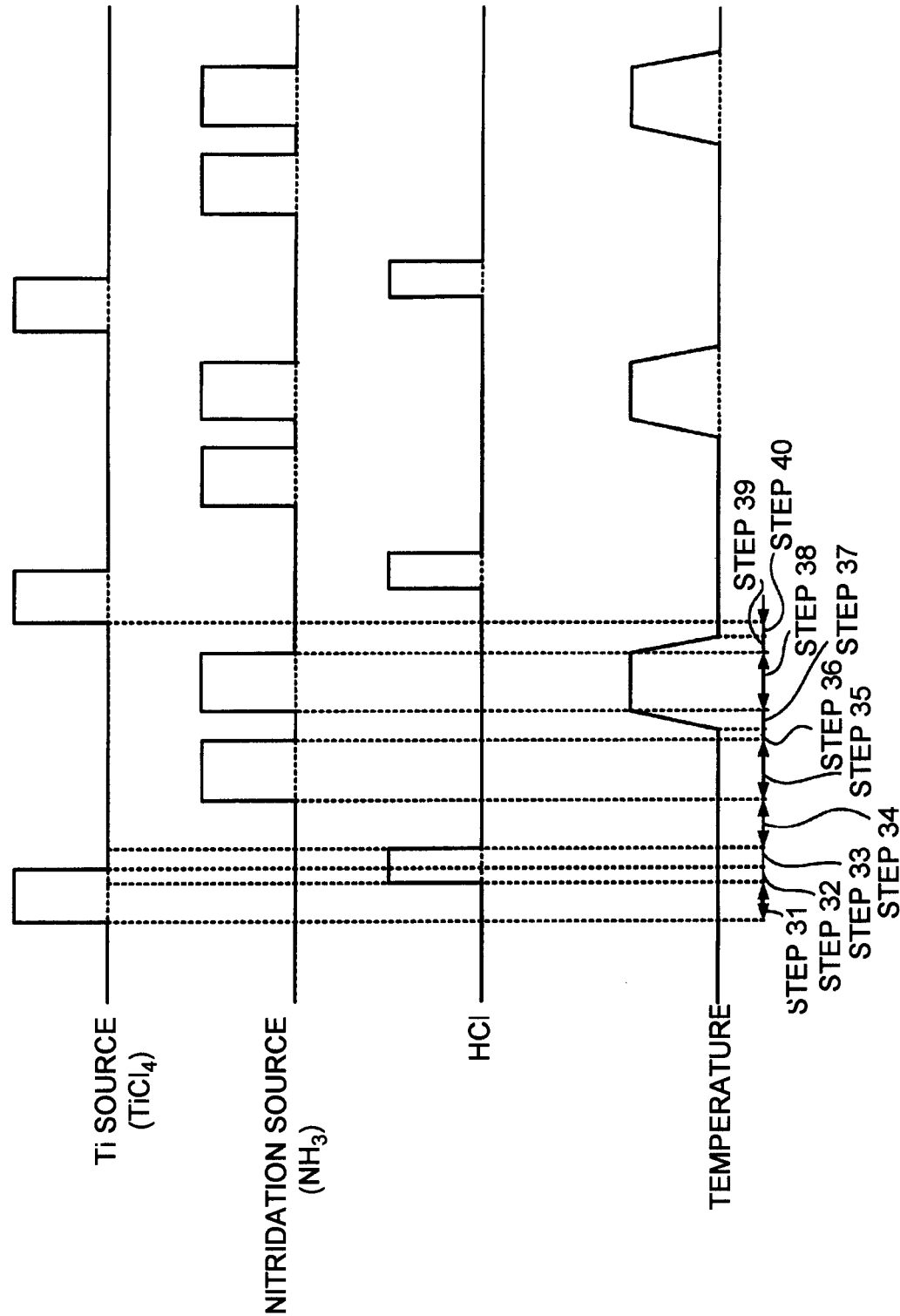

SEMICONDUCTOR DEVICE MANUFACTURING METHOD AND SUBSTRATE PROCESSING APPARATUS

CROSS-REFERENCE TO RELATED PATENT APPLICATION

This U.S. non-provisional patent application is a Division of U.S. patent application Ser. No. 13/693,647 filed on Dec. 4, 2012, and claims priority under 35 U.S.C. §119 of Japanese Patent Application No. 2010-128417 filed on Jun. 4, 2010, and International Application No. PCT/JP2011/062381 filed on May 30, 2011, in the Japanese Patent Office, the entire contents of the prior applications is hereby incorporated by reference.

BACKGROUND OF THE INVENTION

1. Field of the Invention

The present invention relates to a semiconductor device manufacturing method and a substrate processing apparatus and, more particularly, to a semiconductor device manufacturing method including a process of forming a metal layer on a substrate (wafer) and a substrate processing apparatus.

2. Description of the Related Art

A chemical vapor deposition (CVD) method may be a technique of forming a predetermined film on a substrate. The CVD method includes forming a layer having elements included in source molecules as components in a vapor phase or due to a reaction between at least two kinds of sources on a substrate. There is an atomic layer deposition (ALD) method as another technique. The ALD method may include alternately supplying at least two kinds of sources used for forming a film one by one to a substrate under certain film-forming conditions (temperature and time), adsorbing the sources in units of atomic layers, and forming a film to be controlled on an atomic level. In the ALD method, processing may be enabled at a lower substrate temperature (processing temperature). By adsorbing a source gas to a substrate by alternately supplying source gases, forming a film may be repeated per single atomic layer, and the thickness of the formed film may be controlled according to the number of cycles of formation of the film. Also, a titanium nitride (TiN) film disclosed in International Patent Publication WO2007/020874 may be taken as an example of a metal film formed on the substrate.

[Patent Document 1] International Patent Publication WO2007/020874

SUMMARY OF THE INVENTION

When a titanium nitride film is formed as a metal layer on a processed substrate, there may be cases in which, for example, titanium tetrachloride ($TiCl_4$) is used as a titanium (Ti)-containing source and ammonia ($NH_3$) is used as a nitridation gas. However, when the titanium nitride film is formed using a CVD technique, a rise in resistivity may be caused due to the fact that chloride (Cl) easily diffuses into the film, as compared with when a titanium nitride film is formed using an ALD technique.

Meanwhile, a continuous film of the titanium nitride film formed using an ALD technique may obtain a smooth surface and have a low chlorine concentration and a relatively low resistance, as compared with a titanium nitride film formed using a CVD technique. However, with an improvement in required performance of the titanium nitride film, it is necessary to further improve the quality of the titanium nitride film by reducing impurities or lowering resistance.

The above-described example is not limited to the titanium nitride film but becomes generally problematic in forming a metal compound. For example, when a high-k dielectric metal oxide film is formed using an organic metal material, problems such as deterioration of tolerance to insulation may become obvious due to carbon (C) remaining in the film.

Accordingly, the present invention provides a semiconductor device manufacturing method and a substrate processing apparatus, which solve the above-described problem so that a metal film with a low resistivity can be formed due to a high density and a low source-induced dopant concentration.

According to one aspect of the present invention, there is provided a semiconductor device manufacturing method including: (a) supplying a source gas containing a first element and chlorine to a substrate accommodated in a processing chamber to form an adsorption layer of the source gas on the substrate; (b) supplying a chlorine-containing gas having a composition different from that of the source gas to the substrate while supplying the sources gas before an adsorption of the source gas to the substrate is saturated to suppress the adsorption of the source gas to the substrate; (c) removing the source gas and the chlorine-containing gas remaining on the substrate; (d) supplying a modifying gas including a second element to the substrate to form a layer including the first element and the second element on the substrate by modifying the adsorption layer of the source gas; and (e) removing the modifying gas remaining on the substrate.

According to another aspect of the present invention, there is provided a semiconductor device manufacturing method including: (a) supplying a source gas containing a first element and chlorine to a substrate accommodated in a processing chamber to form an adsorption layer of the source gas on the substrate; (b) supplying a chlorine-containing gas having a composition different from that of the source gas to the substrate while supplying the sources gas before an adsorption of the source gas to the substrate is saturated to suppress the adsorption of the source gas to the substrate; (c) removing the source gas and the chlorine-containing gas remaining on the substrate; (d) supplying a modifying gas including a second element to the substrate to form a layer including the first element and the second element on the substrate by modifying the adsorption layer of the source gas; (e) removing the modifying gas remaining on the substrate; and (f) supplying the modifying gas activated by applying light or plasma to desorb the chlorine-containing gas remaining on the layer including the first element and the second element formed on the substrate.

According to still another aspect of the present invention, there is provided a semiconductor device manufacturing method including: (a) supplying a source gas containing a first element and chlorine to a substrate accommodated in a processing chamber while heating the substrate to be at a first temperature to form an adsorption layer of the source gas on the substrate; (b) supplying a chlorine-containing gas having a composition different from that of the source gas to the substrate while supplying the sources gas before an adsorption of the source gas to the substrate is saturated to suppress the adsorption of the source gas to the substrate; (c) removing the source gas and the chlorine-containing gas remaining on the substrate; (d) supplying a modifying gas including a second element to the substrate while heating the substrate to be at a second temperature higher than the first temperature to form a layer including the first element and the second element on the substrate by modifying the adsorption layer of the source gas; and (e) removing the modifying gas remaining on the substrate.

According to further another aspect of the present invention, there is provided a substrate processing apparatus including: a processing chamber configured to accommodate a substrate; a source gas supply system configured to supply a source gas containing a first element and chlorine to the substrate; a chlorine-containing gas supply system configured to supply a chlorine-containing gas having a composition different from that of the source gas to the substrate; a modifying gas supply system configured to supply a modifying gas containing a second element to the substrate; an exhaust system configured to exhaust gases remaining on the substrate; and a controller configured to control the source gas supply system, the chlorine-containing gas supply system, the modifying gas supply system and the exhaust system to perform: (a) supplying a source gas containing a first element and chlorine to a substrate accommodated in a processing chamber to form an adsorption layer of the source gas on the substrate; (b) supplying a chlorine-containing gas having a composition different from that of the source gas to the substrate while supplying the sources gas before an adsorption of the source gas to the substrate is saturated to suppress the adsorption of the source gas to the substrate; (c) removing the source gas and the chlorine-containing gas remaining on the substrate; (d) supplying a modifying gas including a second element to the substrate to form a layer including the first element and the second element on the substrate by modifying the adsorption layer of the source gas; and (e) removing the modifying gas remaining on the substrate.

BRIEF DESCRIPTION OF THE DRAWINGS

FIG. 7 illustrates a film forming sequence according to a third embodiment of the present invention.

FIG. 8 illustrates a film forming sequence according to a fourth embodiment of the present invention.

DETAILED DESCRIPTION OF THE PREFERRED EMBODIMENTS

Hereinafter, exemplary embodiments of the present invention will be described with reference to the accompanying drawings.

A substrate processing apparatus according to the present embodiment is configured as an example of a semiconductor manufacturing apparatus used to manufacture semiconductor devices (integrated circuits (ICs)). Hereinafter, a case in which a vertical apparatus configured to form a film on a substrate is used as an example of a substrate processing apparatus will be described. However, the present invention is not limited to the use of the vertical apparatus and a sheet-fed apparatus may be used as an example.

<Overall Construction of Apparatus>

Figure 1:
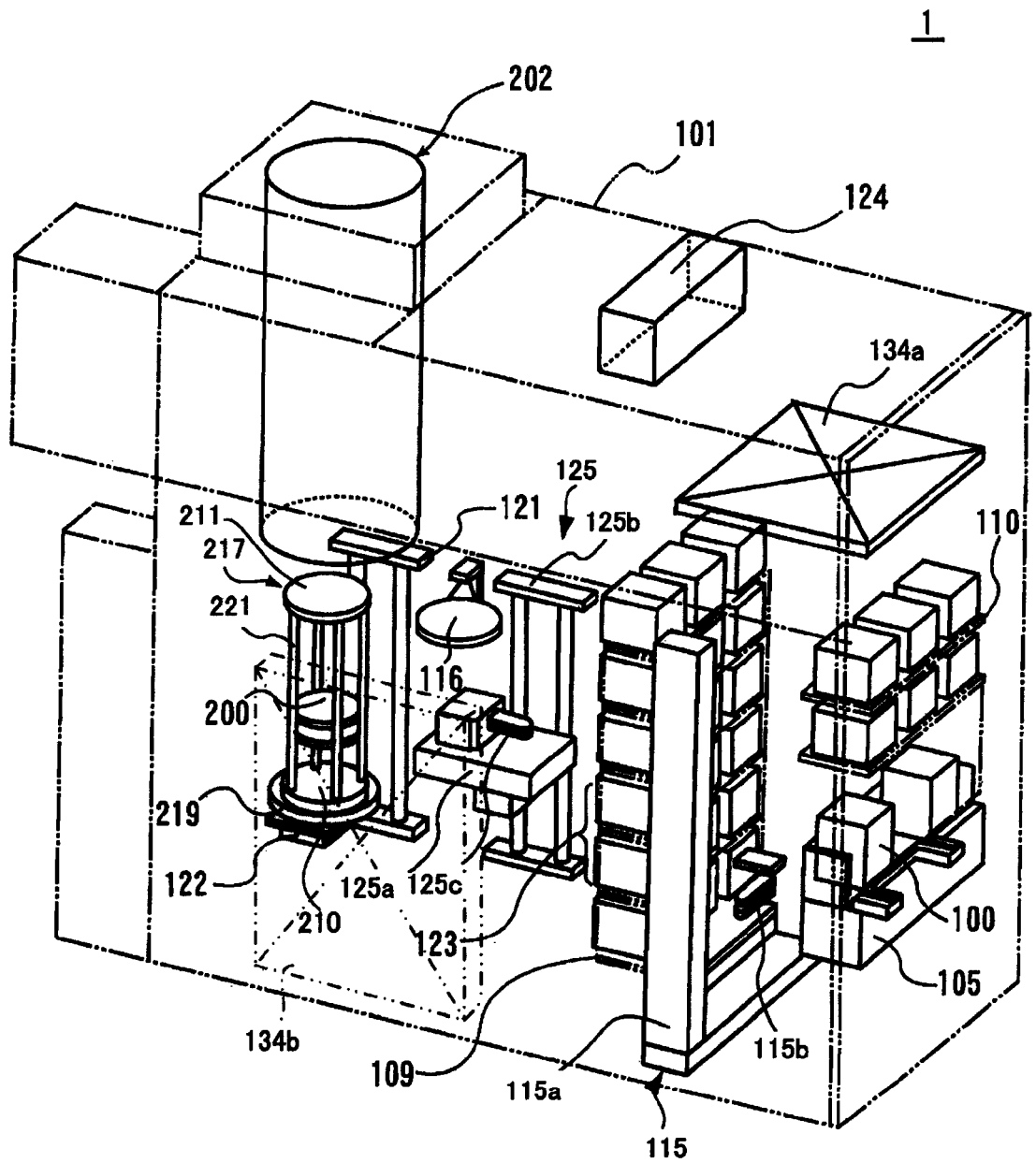
FIG. 1 is an inclined perspective view of a schematic construction of a substrate processing apparatus according to an embodiment of the present invention.

As shown in FIG. 1, in a substrate processing apparatus 1, a cassette 100 accommodating a wafer 200, which is an example of a substrate, is used, and the wafer 200 may be formed of a material such as silicon (Si). The substrate processing apparatus 1 includes a case 101, and a cassette stage 105 is installed inside the case 101. Due to an in-process conveyance apparatus (not shown), the cassette 100 may be loaded on the cassette stage 105 or unloaded from the cassette stage 105.

The cassette stage 105 is loaded by the in-process conveyance apparatus such that the wafer 200 accommodated in the cassette 100 maintains a vertical posture and a wafer entrance of the cassette 100 faces upward. The cassette stage 105 is configured to rotate the cassette 100 rightward by an angle of 90° toward the rear of the case 101 in a longitudinal direction such that the wafer 200 accommodated in the cassette 100 has a horizontal posture and the wafer entrance of the cassette 100 faces the rear of the case 101.

A cassette shelf 109 is installed in a about central region of a forward/backward direction of the case 101. The cassette shelf 109 is configured in a plurality of stages and a plurality of columns to keep a plurality of cassettes 100. A transfer shelf 123 in which the cassette 100 to be conveyed by the wafer transfer mechanism 125 is accommodated is installed in the cassette shelf 109.

A preliminary cassette shelf 110 is installed above the cassette stage 105 and configured to keep the cassette 100 in reserve.

A cassette conveyance apparatus 115 is installed between the cassette stage 105 and the cassette shelf 109. The cassette conveyance apparatus 115 includes a cassette elevator 115a, which is capable of moving up and down with the cassette 100 held, and a cassette conveyance mechanism 115b serving as a conveyance mechanism. Due to continuous operations of the cassette elevator 115a and the cassette conveyance mechanism 115b, the cassette conveyance apparatus 115 may be configured to convey the cassette 100 among the cassette stage 105, the cassette shelf 109 and the preliminary cassette shelf 110.

A wafer transfer mechanism 125 is installed behind the cassette shelf 109. The wafer transfer mechanism 125 includes a wafer transfer apparatus 125a, which is capable of rotating or directly driving the wafer 200 in a horizontal direction, and a wafer transfer apparatus elevator 125b configured to move the wafer transfer apparatus 125a up and down. Tweezers 125c configured to pick up the wafer 200 are installed in the wafer transfer apparatus 125a. Due to continuous operations of the wafer transfer apparatus 125a and the wafer transfer apparatus elevator 125b, the wafer transfer mechanism 125 includes the tweezers 125c as a transfer unit of the wafer 200 and is configured to charge the wafer 200 in a boat 217 or discharge the wafer 200 from the boat 217.

A processing furnace 202 configured to anneal the wafer 200 is installed above a rear unit of the case 101, and a bottom unit of the processing furnace 202 is configured to be opened and closed off by a furnace opening shutter 116.

A boat elevator 121 configured to move the boat 217 up and down with respect to the processing furnace 202 is installed below the processing furnace 202. An arm 122 is connected to an elevation stage of the boat elevator 121, and a seal cap 219 is horizontally installed at the arm 122. The seal cap 219 is configured to be capable of vertically supporting the boat 217 and covering and closing off the bottom end of the processing furnace 202.

The boat 217 includes a plurality of holding members. The boat 217 is configured to adjust centers of a plurality of wafers 200 (e.g., about 50 to 150 wafers 200) in a vertical direction and hold each of the wafers 200 in a horizontal direction.

A cleaning unit 134a configured to supply clean air in a purified atmosphere is installed above the cassette shelf 109. The cleaning unit 134a comprises a supply fan and a dustproof filter to circulate the clean air inside the case 101.

A cleaning unit 134b configured to supply clean air is installed at a left end portion of the case 101. The cleaning unit 134b also comprises a supply fan and a dustproof filter to circulate the clean air in peripheral regions, such as the wafer transfer apparatus 125a or the boat 217. After circulating in the peripheral regions, such as the wafer transfer apparatus 125a or the boat 217, the corresponding clean air may be exhausted from the case 101.

<Operation of Process Apparatus>

Next, main operations of the substrate processing apparatus 1 will now be described.

When the cassette 100 is loaded on the cassette stage 105 by the in-process conveyance apparatus (not shown), the cassette 100 is loaded such that the wafer 200 maintains a vertical posture on the cassette stage 105 and a wafer entrance of the cassette 100 faces upward. Thereafter, the cassette 100 is rotated rightward by an angle of 90° toward the rear of the case 101 in a longitudinal direction such that the wafer 200 accommodated in the cassette 100 has a horizontal posture and the wafer entrance of the cassette 100 faces the rear of the case 101.

Subsequently, the cassette 100 is automatically conveyed and transmitted to a designated shelf position of the cassette shelf 109 or the preliminary cassette shelf 110 by the cassette conveyance apparatus 115 and temporarily kept on the cassette shelf 109 or the preliminary cassette shelf 110. Thereafter, the cassette 100 is transferred or directly conveyed from the cassette shelf 100 or the preliminary cassette shelf 110 to the transfer shelf 123 by the cassette conveyance apparatus 115.

When the cassette 100 is transferred to the transfer shelf 123, the wafer 200 is picked up from the cassette 100 through the wafer entrance by the tweezers 125c of the wafer transfer apparatus 125a and charged in the boat 217. The wafer transfer apparatus 125a configured to transmit the wafer 200 to the boat 217 returns to the cassette 100 and charges a subsequent wafer 200 in the boat 217.

When a predetermined number of wafers 200 are charged in the boat 217, a bottom end of the processing furnace 202 is opened by opening the furnace opening shutter 116 that has closed off the bottom end of the processing furnace 202. Afterwards, the boat 217 charged with a group of wafers 200 is loaded into the processing furnace 202 due to an elevation operation of the boat elevator 121, and a lower portion of the processing furnace 202 is blocked up by the seal cap 219.

After the boat 217 is loaded, the wafer 200 is arbitrarily processed in the processing furnace 202. Thereafter, the wafer 200 and the cassette 100 are unloaded from the case 101 in the reverse order to the above description.

<Construction of Processing Furnace>

Next, the processing furnace 202 applied to the above-described substrate processing apparatus will be described with reference to FIGS. 2 and 3.

Figure 2:
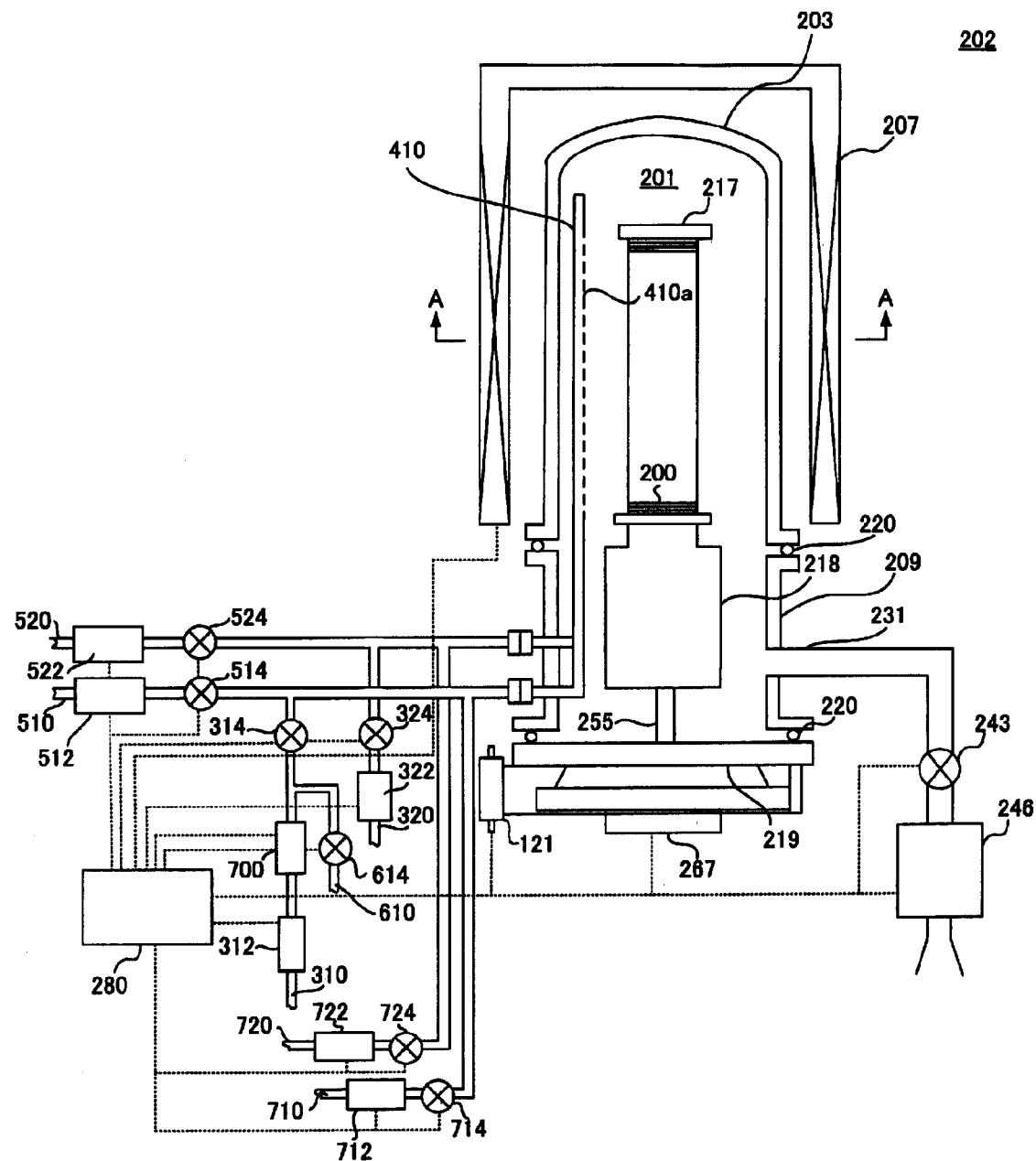
FIG. 2 is a schematic construction diagram of an example of a processing furnace and accompanying members thereof, according to an embodiment of the present invention, particularly, a longitudinal sectional view of a processing furnace portion.
Figure 3:
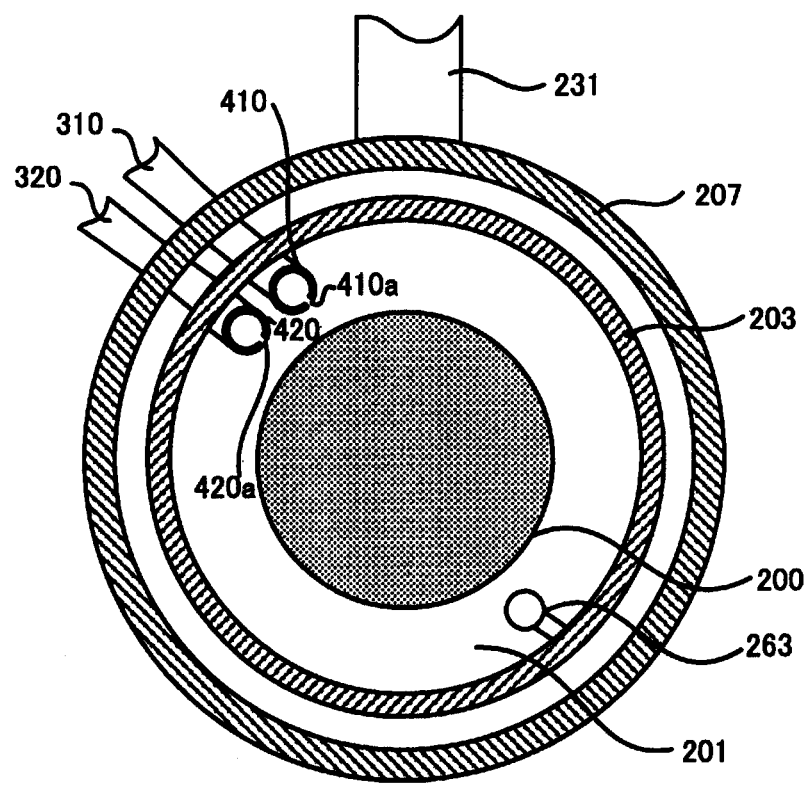
FIG. 3 is a cross-sectional view taken along a line A-A of the processing furnace shown in FIG. 2, according to an embodiment of the present invention.

As shown in FIGS. 2 and 3, a heater 207 serving as a heating apparatus (heating unit) configured to heat the wafer 200 is installed in the processing furnace 202. The heater 207 includes an insulation member having a cylindrical shape with blocked top and bottom ends and a plurality of heater wires. The heater 207 has a unit configuration in which the heater wires are installed with respect to the insulation member. A reaction tube 203 formed of quartz and configured to process the wafer 200 is installed inside the heater 207.

A manifold 209 formed of, for example, stainless steel, is installed at a bottom end of the reaction tube 203 via an O-ring 220 serving as a seal member. A bottom opening of the manifold 209 is hermetically stopped by a seal cap 219 serving as a stopper via the O-ring 220. A processing chamber 201 is constituted by at least the reaction tube 203, the manifold 209 and the seal cap 219 in the processing furnace 202.

A boat support 218 configured to support the boat 217 is installed at the seal cap 219. As illustrated in FIG. 1, the boat 217 includes a bottom plate 210 fixed at the boat support 218 and a ceiling plate 211 disposed above the bottom plate 210, and a plurality of pillars 221 are installed between the bottom plate 210 and the ceiling plate 211. A plurality of wafers 200 are held in the boat 217. The plurality of wafers 200 maintain a horizontal posture at regular intervals and are supported by the pillars 221 of the boat 217.

With a plurality of batch-processed wafers 200 stacked in a plurality of stages with respect to the boat 217, the processing furnace 202 is configured such that the boat 217 is supported by the boat support 218 and inserted into the processing chamber 201, and the heater 207 heats the wafer 200 inserted into the processing chamber 201 to a predetermined temperature.

As shown in FIGS. 2 and 3, two gas supply pipes 310 and 320 [a first gas supply pipe 310 and a second gas supply pipe 320] are connected to the processing chamber 201.

A mass flow controller (MFC) 312 serving as a flow-rate controller (flow-rate control unit), a vaporizer 700 serving as a vaporization unit (vaporizing means), and a valve 314 serving as an opening/closing valve are installed in the gas supply pipe 310 in sequential order from an upstream direction. A nozzle 410 [first nozzle 410] is connected to a front end portion of the gas supply pipe 310. The first nozzle 410 extends in a vertical direction [the direction in which the wafers 200 are stacked] along inner walls of the reaction tube 203 in an arc-shaped space between the inner walls of the reaction pipe 203 constituting the processing chamber 201 and the wafers 200. A plurality of gas supply holes 410a configured to supply a source gas are installed in a lateral surface of the first nozzle 410. Each of the plurality of gas supply holes 410a has the same aperture area or different aperture areas from a lower portion thereof to an upper portion and is installed at the same aperture pitch.

In addition, a vent line 610 and a valve 614 are installed between the vaporizer 700 and the valve 314 in the gas supply pipe 310 and connected to an exhaust pipe 231 to be described later. Thus, when a source gas is not supplied to the processing chamber 201, the source gas is supplied via the valve 614 to the vent line 610. A first gas supply system (source gas supply system) is mainly constituted by the gas supply pipe 310, the MFC 312, the vaporizer 700, the valve 314, the first nozzle 410, the vent line 610 and the valve 614.

In addition, a carrier gas supply pipe 510 configured to supply a carrier gas is connected to the gas supply pipe 310. An MFC 512 and a valve 514 are installed in the carrier gas supply pipe 510. A first carrier gas supply system (first inert gas supply system) is mainly constituted by the carrier gas supply pipe 510, the MFC 512 and the valve 514.

An MFC 322 serving as a flow-rate controller (flow-rate control unit) and a valve 324 are installed in the gas supply pipe 320 in sequential order from an upstream direction. A nozzle 420 [second nozzle 420] is connected to a front end portion of the gas supply pipe 320. Similarly to the first nozzle 410, the second nozzle 420 extends in a vertical direction [the direction in which the wafers 200 are stacked] along inner walls of the reaction tube 203 in an arc-shaped space between the inner walls of the reaction pipe 203 constituting the processing chamber 201 and the wafers 200. A plurality of gas supply holes 420a configured to supply a source gas are installed in a lateral surface of the second nozzle 420. Similarly to the gas supply holes 410a, each of the plurality of gas supply holes 420a has the same aperture area or different aperture areas from a lower portion thereof to an upper portion and is installed at the same aperture pitch. A second gas supply system (modifying gas supply system, reaction gas supply system) is mainly constituted by the gas supply pipe 320, the MFC 322, the valve 324 and the second valve 420.

In addition, a carrier gas supply pipe 520 configured to supply a carrier gas' is connected to the gas supply pipe 320. An MFC 522 and a valve 524 are installed in the carrier gas supply pipe 520. A second carrier gas supply system (second inert gas supply system) is mainly constituted by the carrier gas supply pipe 520, the MFC 522 and the valve 524.

In addition, a gas supply pipe 710 is connected to a downstream direction of the confluence between the gas supply pipe 310 and the carrier gas supply pipe 510. An MFC 712 and a valve 714 are installed in the gas supply pipe 710. A third gas supply system (first chlorine-containing gas supply system) is mainly constituted by the gas supply pipe 710, the MFC 712 and the valve 714.

Furthermore, a gas supply pipe 720 is connected to a downstream direction of the confluence between the gas supply pipe 320 and the carrier gas supply pipe 520. An MFC 722 and a valve 724 are installed in the gas supply pipe 720. A fourth gas supply system (second chlorine-containing gas supply system) is mainly constituted by the gas supply pipe 720, the MFC 722 and the valve 724. According to circumstances, the fourth gas supply system may not be installed.

For example, when a source supplied through the gas supply pipe 310 is a liquid, the source is confluent with the carrier gas supply pipe 510 and also confluent with the gas supply pipe 710 through the gas supply pipe 310 via the MFC 312, the vaporizer 700 and the valve 314, and a reactive gas is supplied into the processing chamber 201 via the first nozzle 410. For example, when a source supplied through the gas supply pipe 310 is a gas, the MFC 312 is replaced by an MFC for gases so that the vaporizer 700 may not be required. Also, the source is confluent with the carrier gas supply pipe 520 and also confluent with the gas supply pipe 720 via the MFC 322 and the valve 324 through the gas supply pipe 320, and a reactive gas is supplied into the processing chamber 201 via the second nozzle 420.

In one example of the above-described construction, a metal source serving as a source gas, for example, a titanium (Ti)-containing source [TiCl$_4$, tetrakis-dimethylamino titanium (TDMAT, Ti[N(CH$_3$)$_2$]$_4$) and tetrakis(diethylamino) titanium (TDEAT, Ti[N(CH$_2$CH$_3$)$_2$]$_4$)] is introduced into the gas supply pipe 310. An oxygen (O)-containing gas or a nitrogen (N)-containing gas serving as a modifying gas for modifying the source gas, for example, a nitridation source, such as ammonia (NH$_3$), nitrogen (N$_2$), nitrous oxide (N$_2$O), or monomethyl hydrazine (CH$_6$N$_2$), is introduced into the gas supply pipe 320. A chlorine (Cl)-containing gas serving as a reactive gas for causing a reaction with the source gas, for example, hydrogen chloride (HCl) or chlorine (Cl$_2$), is introduced into the gas supply pipes 710 and 720.

An exhaust pipe 231 configured to exhaust the atmosphere of the processing chamber 201 is installed in the reaction tube 203. A vacuum pump 246 serving as a vacuum exhaust apparatus (exhaust unit) is connected to the exhaust pipe 231 via a pressure sensor (not shown) serving as a pressure detector (pressure detection unit) configured to detect the pressure of the processing chamber 201 and an auto-pressure controller (APC) valve 243 serving as a pressure regulator (pressure regulating unit). The vacuum pump 246 is configured to vacuum-exhaust the processing chamber 201 such that an inner pressure of the processing chamber 201 reaches a predetermined pressure (degree of vacuum). An exhaust system is mainly constituted by the exhaust pipe 231, the APC valve 243, the vacuum pump 246 and the pressure sensor.

A temperature sensor 263 serving as a temperature detector is installed in the reaction tube 203. The temperature sensor 263 is configured to adjust a state of application of current to the heater 207 based on temperature information detected by the temperature sensor 263 such that the inner temperature of the pressure chamber 201 has a desired temperature distribution. The temperature sensor 263 is configured in an L shape like the nozzles 410 and 420 and installed along the inner wall of the reaction tube 203.

A boat 217 is installed in a central portion of the reaction tube 203. A boat rotation mechanism 267 configured to rotate the boat 217 to improve processing uniformity is installed in a bottom end unit of the boat support 218 configured to support the boat 217. A rotation axis 255 of the boat rotation mechanism 267 is connected to the boat 217 through the seal cap 219 and configured to rotate the boat 217 to rotate the wafer 200. The seal cap 219 is configured to move up and down in a vertical direction due to a boat elevator 121 installed outside the reaction tube 203 so that the boat 217 can be loaded into and unloaded from the processing chamber 201.

Each of members, such as the MFCs 312, 322, 512, 522, 712 and 722, the valves 314, 324, 514, 524, 614, 714 and 724, the heater 207, the temperature sensor 263, the vacuum pump 246, the pressure sensor, the APC valve 243, the boat rotation mechanism 267 and the boat elevator 121, is connected to the controller 280. The controller 280 is an example of a control unit (control means) configured to control the overall operation of the substrate processing apparatus 1. The controller 280 is configured to control each of operations of adjusting flow rates using the MFCs 312, 322, 512, 522, 712 and 722, operations of opening and closing off the valves 314, 324, 514, 524, 614, 714 and 724, an operation of adjusting a pressure based on the opening/closing of the APC valve 243 and the pressure sensor, an operation of adjusting a temperature of the heater 207 based on the temperature sensor 263, an operation of running and stopping the vacuum pump 246, an operation of controlling a rotation rate of the boat rotation mechanism 267 and an operation of moving the boat 217 up and down using the boat elevator 121.

<Method of Manufacturing Semiconductor Device>

Next, an example of a method of forming an insulating film on a substrate to manufacture a large scale integrated circuit, as a process of manufacturing a semiconductor device, using the processing furnace 202 of the above-described substrate processing apparatus will be described. In the following description, an operation of each of units of the substrate processing apparatus is controlled by the controller 280.

First Embodiment

In the present embodiment, a method of forming a titanium nitride film as a metal film on a substrate will now be described. In the present embodiment, an example of a process using TiCl$_4$ gas as a titanium (Ti)-containing source serving as a source gas, NH$_3$ gas as a nitridation gas serving as a modifying gas, and HCl as a chlorine-containing gas serving as a reactive gas will be described.

Figure 4:
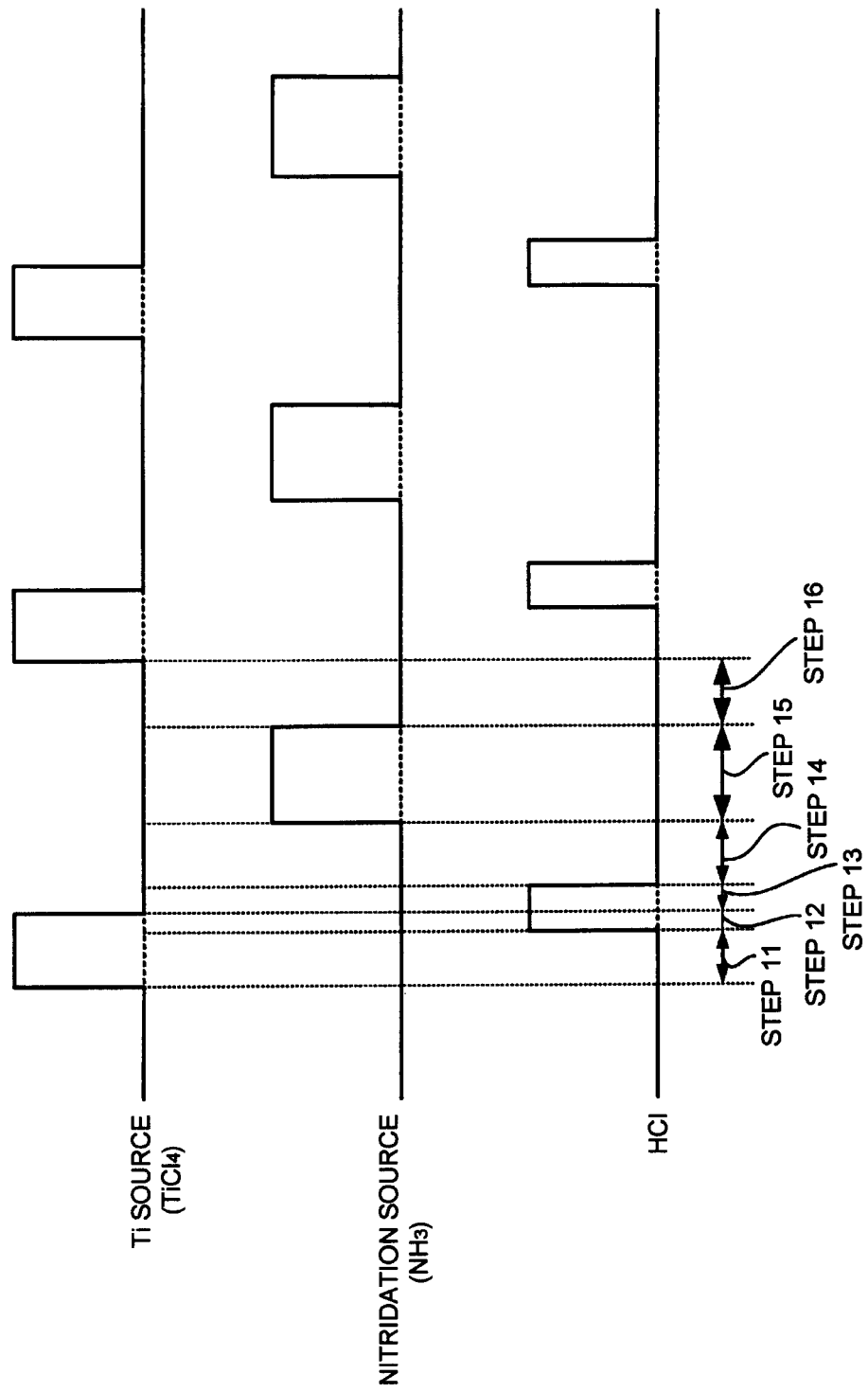
FIG. 4 illustrates a film forming sequence according to a first embodiment of the present invention.

FIG. 4 illustrates a film forming sequence according to a first embodiment of the present invention. In a film forming process, the controller 280 may control the substrate processing apparatus 1 as will be described below. That is, by controlling the heater 207, the inside of the processing chamber 201 is set to a temperature of, for example, about 200° C. to about 650° C., preferably, a temperature of about 300° C. to about 500° C. Thereafter, a plurality of wafers 200 may be charged in the boat 217, and the boat 217 may be loaded into the processing chamber 201. Afterwards, the boat 217 may be rotated by the boat driving mechanism 267 to rotate the wafer 20. Thereafter, the inside of the processing chamber 201 is vacuum-exhausted by opening the valve 243 with the vacuum pump 246 operated. A sequence to be described later is performed with the wafer 200 maintained at a temperature ranging from about 200° C. to about 650° C., preferably, about 300° C. to about 500° C.

(Step 11)

Titanium tetrachloride (TiCl$_4$) is supplied in step 11. Since TiCl$_4$ is a liquid at room temperature, a method of supplying TiCl$_4$ into the processing chamber 201 may include a process of supplying TiCl$_4$ after vaporizing TiCl$_4$ by heating or a process of allowing an inert gas called a carrier gas, such as helium (He), neon (Ne), argon (Ar), or nitrogen (N$_2$), to pass through a TiCl$_4$ container using the vaporizer 700 and supplying the vaporized amount into the processing chamber 201 along with the carrier gas. However, the latter process will now be described as an example.

TiCl$_4$ is supplied to the gas supply pipe 310, and a carrier gas (N$_2$) is supplied to the carrier gas supply pipe 510. The valve 314 of the gas supply pipe 310, the valve 514 of the carrier gas supply pipe 510 and the APC valve 243 of the exhaust pipe 231 are opened together. The carrier gas is supplied through the carrier gas supply pipe 510 and flow-adjusted by the MFC 512. TiCl$_4$ is supplied through the gas supply pipe 310, flow-adjusted by the MFC 312, vaporized by the vaporizer 700, mixed with the flow-adjusted carrier gas, supplied into the processing chamber 201 through the gas supply hole 410a of the nozzle 410, and exhausted through the exhaust pipe 231. In this case, an inner pressure of the processing chamber 201 is maintained within the range of about 20 Pa to about 100 Pa, for example, at about 30 Pa, by appropriately adjusting the APC valve 243. A flow rate of the supplied TiCl$_4$ is controlled by the MFC 312 to be in the range of about 1.0 g/min to about 2.0 g/min. A time taken to expose the wafer 200 to TiCl$_4$ ranges from about 3 seconds to about 10 seconds. A temperature of the heater 207 is set such that the wafer 200 is maintained at a temperature ranging from about 200° C. to about 650° C., preferably, about 300° C. to about 500° C., for example, at a temperature of about 380° C.

In this case, only TiCl$_4$ and inert gases such as N$_2$ and Ar are supplied into the processing chamber 201, and NH$_3$ and HCl are not supplied. Accordingly, TiCl$_4$ does not cause a vapor reaction but causes a surface reaction (chemical adsorption) with the surface of the wafer 200 or an under film to form an adsorption layer of the source (TiCl$_4$) or a titanium (Ti) layer (hereinafter, a titanium-containing layer). The adsorption layer of TiCl$_4$ includes not only a continuous adsorption layer of source molecules but also a discontinuous adsorption layer. The Ti layer includes a discontinuous layer formed of Ti but also a Ti thin film obtained by overlapping continuous layers formed of Ti. Also, a continuous layer formed of Ti may be called a Ti thin film.

Simultaneously, an inert gas is supplied through the carrier gas supply pipe 520 connected to a midway point of the gas supply pipe 320 by opening the valve 524. Thus, TiCl$_4$ may be prevented from returning to the side of NH$_3$.

(Step 12)

HCl is supplied in step 12. HCl serves to inhibit the growth of TiN. HCl is supplied to the gas supply pipe 710. The valve 714 of the gas supply pipe 710 is opened. TiCl$_4$, which is mixed with the carrier gas and supplied through the gas supply pipe 310, is mixed with HCl flow-adjusted by the MFC 712, supplied into the processing chamber 201 through the gas supply hole 410a of the nozzle 410, and exhausted through the exhaust pipe 231.

In this case, an inert gas, such as N$_2$ gas, is continuously supplied into the processing chamber 201 through the gas supply hole 420a of the nozzle 420.

(Step 13)

The supply of TiCl$_4$ to the processing chamber 201 is stopped by closing off the valve 314 of the gas supply pipe 310, and TiCl$_4$ is supplied to the vent line 610 by opening the valve 614. Thus, only a mixture of HCl and the carrier gas is supplied through the gas supply hole 410a of the nozzle 410. When HCl is supplied, an inner pressure of the processing chamber 201 is maintained in the range of about 10 Pa to about 50 Pa, for example, at 20 Pa, by appropriately adjusting the APC valve 243. A flow rate of the supplied HCl is controlled by the MFC 712 to be in the range of about 0.5 slm to about 5 slm. A time taken to expose the wafer 200 to HCl ranges from about 1 second to about 5 seconds. A temperature of the heater 207 is set such that the wafer 200 is maintained at a temperature ranging from about 200° C. to about 650° C., preferably, about 300° C. to about 500° C., for example, at a temperature of about 380° C.

(Step 14)

The supply of HCl into the processing chamber 201 is stopped by closing off the valve 714 of the gas supply pipe 710. In this case, with the APC valve 243 of the gas supply pipe 231 open, the inside of the processing chamber 201 is exhausted by the vacuum pump 246 until an inner pressure of the processing chamber 201 reaches 10 Pa or lower. Thus, the remaining TiCl$_4$ is excluded from the processing chamber 201. In this case, an inert gas, such as N$_2$ gas, is continuously supplied into the processing chamber 201 through the gas supply hole 420a of the nozzle 420. Thus, the remaining TiCl$_4$ is excluded more effectively.

(Step 15)

NH$_3$ is supplied in step 15. NH$_3$ is supplied to the gas supply pipe 320, and a carrier gas (N$_2$) is supplied to the carrier gas supply pipe 520. The valve 324 of the gas supply pipe 320, the valve 522 of the carrier gas supply pipe 520 and the APC valve 243 of the exhaust pipe 231 are opened together. The carrier gas is supplied through the carrier gas supply pipe 520 and flow-adjusted by the MFC 522. NH$_3$ is supplied through the gas supply pipe 320, flow-adjusted by the MFC 322, mixed with the flow-adjusted carrier gas, supplied into the processing chamber 201 through the gas supply hole 420a of the nozzle 420, and exhausted through the exhaust pipe 231. When NH$_3$ is supplied, an inner pressure of the processing chamber 201 is maintained within the range of about 50 Pa to about 1000 Pa, for example, at 60 Pa, by appropriately controlling the APC valve 243. A flow rate of the supplied NH$_3$ controlled by the MFC 324 ranges from about 1 slm to about 10 slm. A time taken to expose the wafer 200 to NH$_3$ ranges from about 10 seconds to about 45 seconds. A temperature of the heater 207 is set such that the wafer 200 is maintained at a temperature ranging from about 200°

C. to about 650° C., preferably, about 300° C. to about 500° C., for example, at a temperature of about 380° C.

Simultaneously, an inert gas, such as $N_2$, is supplied through the carrier gas supply pipe 510 connected to a midway point of the gas supply pipe 310 by opening the opening/closing valve 514. Thus, $NH_3$ may be prevented from returning to the side of $TiCl_4$.

By supplying $NH_3$, a surface reaction (chemical adsorption) occurs between the titanium-containing layer chemisorbed on the wafer 200 and $NH_3$ to form a titanium nitride film on the wafer 200.

(Step 16)

In step 16, the supply of $NH_3$ is stopped by closing off the APC valve 324 of the gas supply pipe 320. In this case, with the APC valve 243 of the gas supply pipe 231 open, the processing chamber 201 is exhausted to an inner pressure of about 10 Pa or lower by the vacuum pump 246. Thus, the remaining $NH_3$ is excluded from the processing chamber 201. In this case, when an inert gas, such as $N_2$ gas, is supplied into the processing chamber 201 through each of the gas supply pipe 320 serving as an $NH_3$ supply line and the gas supply pipe 310 serving as a $TiCl_4$ supply line, the remaining $NH_3$ is excluded more effectively.

By performing one cycle including steps 11 through 16 at least once, a titanium nitride film is formed to a predetermined thickness on the wafer 200.

Figure 5:
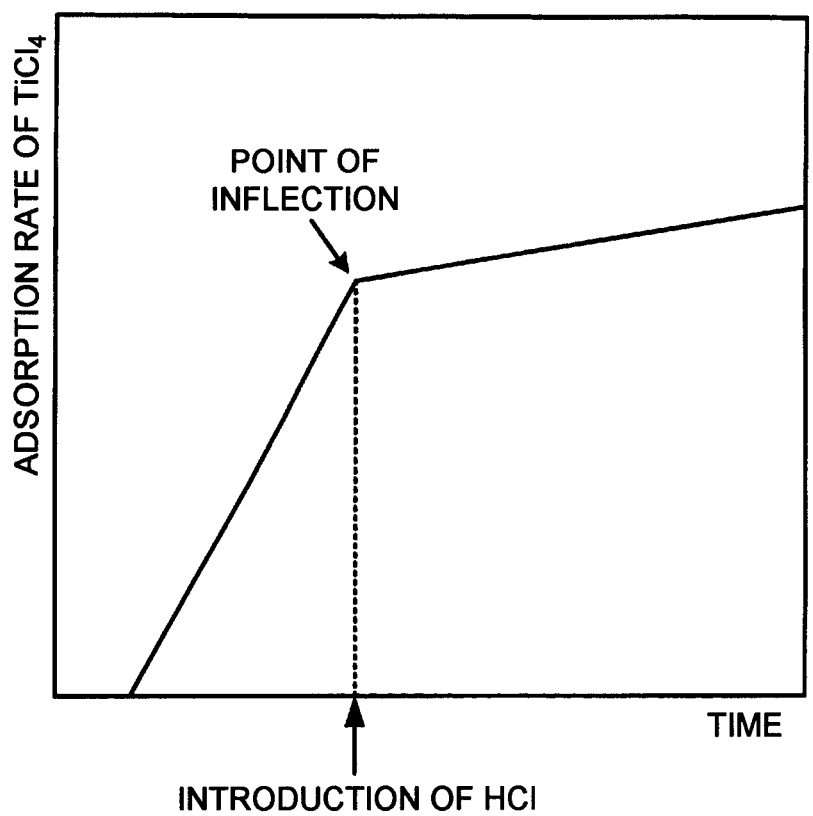
FIG. 5 illustrates a state of adsorption rate of titanium tetrachloride ($TiCl_4$) before and after introducing hydrogen chloride (HCl).

As described above, by introducing $TiCl_4$ into the processing chamber 201, $TiCl_4$ is adsorbed on an adsorption site of the wafer 200 so that the surface of the wafer 200 can be slowly coated with TiClx. Although a time taken to coat the surface of the wafer 200 with TiClx depends on an ambient temperature, an introduced flow rate, or a pressure, the time ranges from about several seconds to about several tens of seconds. Also, before a time point (saturation point) when $TiCl_4$ is adsorbed on all adsorption sites, HCl serving as a reaction inhibiting material is introduced once $TiCl_4$ has been introduced. The introduced HCl fills portions of the adsorption sites, thereby hindering the adsorption of $TiCl_4$. When comparing an increase rate of the adsorbed amounts of $TiCl_4$ before and after the introduction of HCl, a point of inflection occurs in the graph as illustrated in FIG. 5. That is, the introduction of HCl leads to a drop in the adsorption rate of $TiCl_4$. By use of the drop in the adsorption rate of $TiCl_4$, the supply of $TiCl_4$ and HCl is stopped before all absorbable sites of the surface of the wafer 200 are covered with TiClx. Thus, the surface of the wafer 200 is covered with one atomic layer or less of $TiCl_x$ having. In this state, impurities remaining on the film may be inhibited to a minimum so that a subsequent process of growing or modifying a thin film can be finished only by substituting some atoms of a polar surface. Next, after purging the remaining $TiCl_4$ from the processing chamber 201, $NH_3$ may be introduced. $NH_3$ may react with TiClx formed on the surface of the processed substrate so that TiN can be grown and simultaneously, HCl can be desorbed from the surface of the substrate. Next, the remaining $NH_3$ is purged from the processing chamber 201, and the above-described processing operation is repeated until a desired film thickness is obtained, thereby obtaining a TiN film with good quality.

That is, by supplying HCl as a reaction inhibiting material, the amount of Ti adsorbed on the substrate is reduced, and afterwards, $NH_3$ is supplied to cause a reaction of Ti with a sufficient amount of nitrogen (N). As a result, an N-richer film may be formed to lower the resistivity of the TiN film.

Second Embodiment

Figure 6:
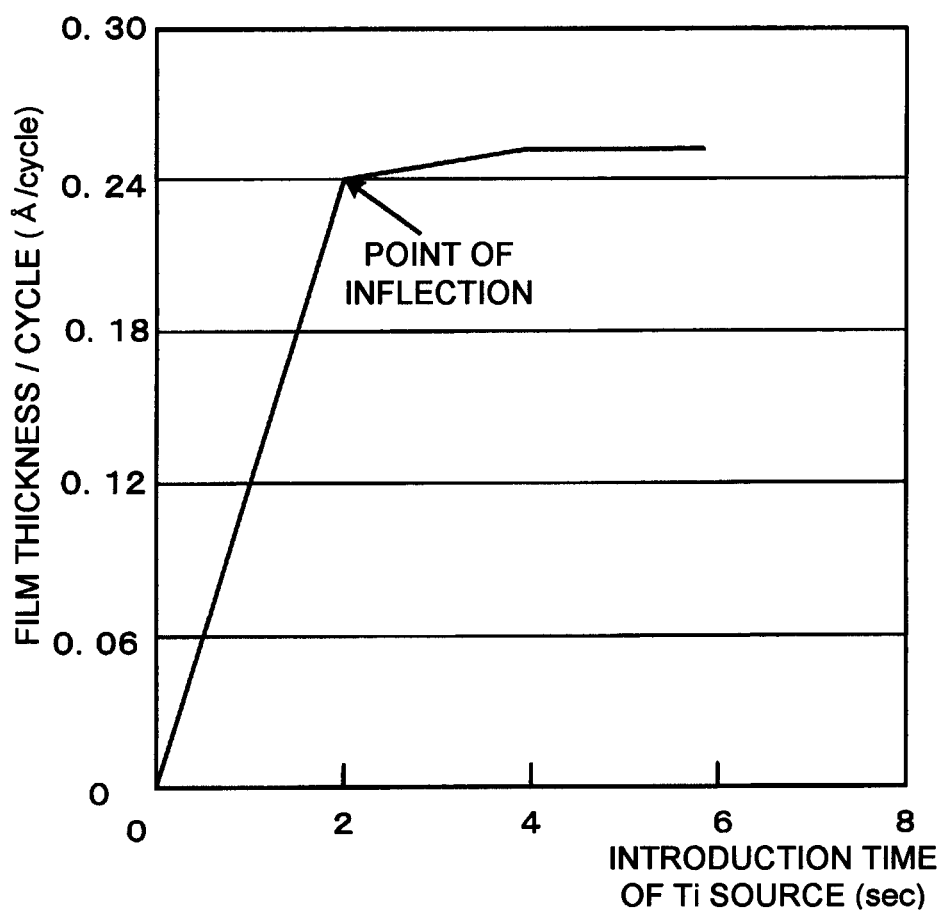
FIG. 6 is a diagram for explaining a second embodiment of the present invention.

While a film of less than one atomic layer is formed in detail by introducing a reaction inhibiting material into the processing chamber 201 in the first embodiment, a by-product generated by optimizing a reactive gas and reaction conditions without introducing the reaction inhibiting material is employed in the second embodiment. For example, the amount of a formed film at a point of inflection may be controlled by controlling a film forming temperature or pressure. The second embodiment describes an example case in which $TiCl_4$ is used as a titanium (Ti)-containing gas serving as a source gas and $NH_3$ is used as a nitridation source serving as a modifying gas. As in the first embodiment, during a film forming process according to the second embodiment, the controller 280 controls the substrate processing apparatus 1 as will be described below. That is, the inside of the processing chamber 201 is set to a temperature ranging from about 250° C. to about 450° C. by controlling the heater 207, and maintained under a pressure of about 10 Pa to about 100 Pa, and the same process as in the above-described first embodiment is performed. FIG. 6 illustrates an example case in which a TiN film is formed under the above-described conditions. As shown in FIG. 6, it can be seen that a film-forming amount for each film-forming process, which may be obtained by dividing a final film-forming thickness by the number of times films are formed in a series using an introduction time of $TiCl_4$ for each film-forming process as a parameter is less than one atomic layer and not proportional to time even if time is extended. Also, it can be seen that formation of a film is not saturated in a time region after the point of inflection. In low-order plane orientation indices, since one atomic layer of TiN crystals ranges from about 1 Å to about 3 Å, it can be seen in the present example that a film having about 1/10 of an atomic layer to about 1/4 of an atomic layer is formed for each series film-forming process.

Third Embodiment

In the third embodiment, light or plasma energy is used to activate a modifying gas and desorb a reaction inhibiting material from the surface. FIG. 7 illustrates a film forming sequence according to a third embodiment of the present invention. In the third embodiment, only different points from the first embodiment will be described.

(Step 21)

In step 21, $TiCl_4$ is supplied into the processing chamber via the nozzle 410 under the same condition as in step 11. In this case, an inert gas, such as $N_2$, is supplied into the processing chamber via the nozzle 420.

(Step 22)

As in step 12, HCl is supplied into the processing chamber via the nozzle 410 through the gas supply pipe 710 with $TiCl_4$ supplied into the processing chamber. In this case, an inert gas, such as $N_2$, is continuously supplied through the nozzle 420.

(Step 23)

As in step 13, with HCl supplied into the processing chamber, the supply of $TiCl_4$ into the processing chamber is stopped by closing off the valve 314 of the gas supply pipe 310, and $TiCl_4$ is supplied to the vent line 610 by opening the valve 614.

(Step 24)

As in step 14, the supply of HCl into the processing chamber is stopped by closing off the valve 714 of the gas supply pipe 710. In this case, with the APC valve 243 of the gas exhaust pipe 231 open, the inside of the processing chamber is exhausted to a pressure of about 20 Pa or lower by the vacuum pump 246. Thus, the remaining $TiCl_4$ is excluded from the processing chamber 201. In this case, when an inert gas, such as $N_2$, is supplied into the processing chamber 201 through the nozzle 420, the remaining $TiCl_4$ is excluded more effectively.

(Step 25)

In step 25, $NH_3$ is supplied into the processing chamber under the same condition as in step 15. $NH_3$ is supplied into the gas supply pipe 320, and a carrier gas ($N_2$) is supplied into the carrier gas supply pipe 520.

(Step 26)

In step 26, the supply of $NH_3$ is stopped by closing off the valve 324 of the gas supply pipe 320. Also, the processing chamber 201 is exhausted to a pressure of about 20 Pa or lower by the vacuum pump 246 with the APC valve 243 of the gas exhaust pipe 231. Thus, the remaining $NH_3$ is excluded from the processing chamber 201.

(Step 27)

In step 27, light or plasma is irradiated while supplying $NH_3$ into the processing chamber again. For example, $NH_3$ is supplied under the same conditions as in steps 15 and 25.

(Step 28)

In step 28, the supply of $NH_3$ is stopped by closing off the valve 324 of the gas supply pipe 320. Also, the processing chamber 201 is exhausted to a pressure of about 20 Pa or lower by the vacuum pump 246 with the APC valve 243 of the gas exhaust pipe 231 open. Thus, the remaining $NH_3$ is excluded from the processing chamber 201.

By performing one cycle including steps 21 through 28 at least once a predetermined number of times, a titanium nitride film is formed to a predetermined thickness on the wafer 200. As described above, desorption of a reaction inhibiting material is promoted by applying light or plasma. Also, $NH_3$ is introduced so as to enable nitridation even if unreacted Ti is dispersed. Although the third embodiment describes a case in which application of light or plasma and introduction of $NH_3$ are performed simultaneously, the application of light or plasma and the introduction of $NH_3$ may not necessarily be performed simultaneously.

Fourth Embodiment

As in the above-described third embodiment, in the fourth embodiment, thermal energy is used to activate a modifying gas and desorb a reaction inhibiting material from the surface. FIG. 8 illustrates a film forming sequence according to a fourth embodiment of the present invention. In the fourth embodiment, only different points from the first embodiment will be described.

(Step 31)

In step 31, $TiCl_4$ is supplied into the processing chamber under the same condition as in step 11. A temperature of the heater 207 is set such that the wafer 200 is maintained at a temperature ranging from about 200° C. to about 550° C., preferably, about 350° C. to about 450° C., for example, at a temperature of about 380° C.

(Step 32)

As in step 12, HCl is supplied to the processing chamber through the gas supply pipe 710 via the nozzle 410 with $TiCl_4$ supplied to the processing chamber. In this case, an inert gas, such as N2, is continuously supplied to the processing chamber through the nozzle 420.

(Step 33)

As in step 13, with HCl supplied to the processing chamber, the supply of $TiCl_4$ to the processing chamber is stopped by closing off the valve 314 of the gas supply pipe 310, and $TiCl_4$ is supplied to the vent line 610 by opening the valve 614.

(Step 34)

As in step 14, the supply of HCl into the processing chamber is stopped by closing off the valve 714 of the gas supply pipe 710. In this case, the inside of the processing chamber 201 is exhausted to a pressure of about 10 Pa or lower by the vacuum chamber 246 with the APC 243 of the gas exhaust pipe 231 open. Thus, the remaining $TiCl_4$ is excluded from the processing chamber 201. In this case, when an inert gas, such as $N_2$, is supplied into the processing chamber 201, the remaining $TiCl_4$ is excluded more effectively.

(Step 35)

In step 35, $NH_3$ is supplied under the same conditions as in step 15. $NH_3$ is supplied to the gas supply pipe 320, while the carrier gas ($N_2$) is supplied to the carrier gas supply pipe 520.

(Step 36)

In step 36, the supply of $NH_3$ is stopped by closing off the valve 324 of the gas supply pipe 320. Also, the processing chamber 201 is exhausted to an inner pressure of about 20 Pa or lower by the vacuum pump 246 with the APC valve 243 of the gas exhaust pipe 231 open. Thus, the remaining $NH_3$ is exhausted from the processing chamber 201.

(Step 37)

In step 37, raising an inner temperature of the processing chamber 201 is initiated.

(Step 38)

In step 38, $NH_3$ is supplied again. $NH_3$ is supplied under the same condition as in steps 15 and 25. A temperature of the heater 207 is set such that the wafer is maintained at a temperature ranging from about 300° C. to about 650° C., preferably, about 400° C. to about 650° C., for example, at a temperature of about 650° C.

(Step 39)

In step 39, the supply of $NH_3$ is stopped by closing off the valve 324 of the gas supply pipe 320, and an inner temperature of the processing chamber is dropped.

(Step 40)

The inner temperature of the processing chamber is maintained in the range of about 200° C. to about 550° C., preferably, about 350° C. to about 450° C. In steps 39 and 40, the processing chamber 201 is exhausted to an inner pressure of about 10 Pa or lower with the APC valve 243 of the gas exhaust pipe 231 open. Thus, the remaining $NH_3$ is excluded from the processing chamber 201.

By performing a cycle including steps 31 through 40 at least once a predetermined number of times, a titanium nitride film is formed to a predetermined thickness on the wafer 200. As described above, desorption of a reaction inhibiting material is promoted by varying the inner temperature of the processing chamber. Also, $NH_3$ is introduced so as to enable nitridation even if unreacted Ti is dispersed. Although the fourth embodiment describes a case in which a raise in temperature and introduction of $NH_3$ are performed simultaneously, the raise in temperature and the introduction of $NH_3$ may not necessarily be performed simultaneously.

Although the present embodiment exemplarily describes an example case in which HCl serving as a reaction inhibiting material is supplied from the outside of a processing chamber, the present process is still effective even if HCl generated as a by-product of a reaction in the processing chamber is supplied to the surface of the wafer 200 as in the second embodiment instead of supplying HCl from the outside of the processing chamber.

In the above-described embodiments, the order of introduction of respective gases and the number of times each of the gases is introduced may be changed without departing from the spirit of the invention.

When HCl serving as a reaction inhibiting material is supplied through the same nozzle as NH$_3$, ammonium nitrate (NH$_4$Cl) is likely to occur as a by-product. Accordingly, HCl serving as the reaction inhibiting material is preferably supplied only through the nozzle [nozzle 410] for TiCl$_4$. However, when a combination of sources which is unlikely to generate by-products is used, the reaction inhibiting material may be supplied all the nozzles [for example, the nozzles 410 and 420].

According to the present invention, by performing a sequential film-forming process, which is more subdivided than an ALD process, impurities may be inhibited from remaining in the film. Also, since a surface layer of a thin film to be modified may be formed to a smaller thickness, a film quality can be improved more effectively.

In the present embodiments, a portion in which growth of less than one atomic layer occurs is referred to as a thin film or layer for the sake of convenience. Here, the growth of less than one atomic layer refers to a case in which the number of atoms per unit area included in a thin film grown using a one-time series film forming process is smaller than the number of atoms per unit area required for forming one atomic layer of a thin film having an originally estimated plane orientation.

Although a vertical apparatus has been mainly described above, a process of forming a titanium nitride film using at least two different CVD methods according to the present invention is not limited to the vertical apparatus and may be applied to other apparatuses, such as a single-type apparatus.

Furthermore, although a vertical thermal CVD apparatus has been mainly described above, formation of a titanium nitride film using at least two different CVD methods according to the present invention is not limited to a thermal CVD apparatus but may be applied to another apparatus, such as a plasma CVD apparatus or an optical CVD apparatus.

Furthermore, although an example case in which a titanium nitride film is formed on a substrate due to a reaction of titanium tetrachloride (TiCl$_4$) with ammonia (NH$_3$) has been described, the present invention is not limited thereto and may be applied to different kinds of films. In particular, the present invention may be applied to a metal compound obtained by adding an element to a nitride serving as a main substance, such as titanium nitride (TiN) or tantalum nitride (TaN).

In addition, although a case where HCl is used as a reaction inhibiting material has been described, the present invention is not limited thereto and another material may be applied. For example, a halogen gas (chlorine-containing gas) or Cl$_2$ may be applied.

The present invention provides a semiconductor device manufacturing method and a substrate processing apparatus by which a metal film with a low resistivity is formed due to a high density and a low source-induced dopant concentration.

Aspects of the Present Invention

Hereinafter, aspects of the present invention will be added.
(Supplementary Note 1)
According to an aspect of the present invention, there is provided a semiconductor device manufacturing method of forming a film of less than one atomic layer on a substrate, the method including: (a) supplying a source gas into a processing chamber accommodating the substrate to adsorb the source gas on the substrate; (b) supplying a reactive gas different from the source gas into the processing chamber to cause a reaction of the reactive gas with the source gas adsorbed on the substrate before the source gas is saturatively adsorbed on the substrate; (c) removing an inner atmosphere of the processing chamber; and (d) supplying a modifying gas into the processing chamber to modify the source gas adsorbed on the substrate.

(Supplementary Note 2)
The reactive gas preferably includes a chlorine (Cl)-containing gas.

(Supplementary Note 3)
Preferably, the source gas includes a metal source, and the modifying gas includes at least one of an oxygen (O)-containing gas and a nitrogen (N)-containing gas.

(Supplementary Note 4)
Preferably, step (d) includes activating the modifying gas using at least one of heat, light, and plasma.

(Supplementary Note 5)
Preferably, the method is performed by setting the substrate to a temperature of about 200° C. to about 550° C.

(Supplementary Note 6)
Preferably, the method is performed by setting the substrate to a temperature of about 300° C. to about 450° C.

(Supplementary Note 7)
Preferably, the method is performed by setting the substrate to a temperature equal to or lower than a self-decomposition temperature of the source gas.

(Supplementary Note 8)
According to another aspect of the present invention, there is provided a semiconductor device manufacturing method of forming a film of less than one atomic layer on a substrate, the method including: (a) supplying a source gas into a processing chamber accommodating the substrate to adsorb the source gas of less than one atomic layer on the substrate; and (b) supplying a modifying gas for modifying the source gas adsorbed on the substrate into the processing chamber.

(Supplementary Note 9)
According to another aspect of the present invention, there is provided a semiconductor device manufacturing method of forming a film of less than one atomic layer on a substrate, the method including: (a) supplying a source gas into a processing chamber accommodating the substrate to adsorb the source gas on the substrate; (b) supplying a reactive gas different from the source gas into the processing chamber to cause a reaction of the reactive gas with the source gas adsorbed on the substrate before the source gas is saturatively adsorbed on the substrate; (c) removing an inner atmosphere of the processing chamber; (d) supplying a modifying gas into the processing chamber to modify the source gas adsorbed on the substrate; (e) removing the inner atmosphere of the processing chamber; and (f) supplying the modifying gas into the processing chamber while activating the modifying gas to modify the source gas adsorbed on the substrate, wherein steps (a) to (f) are sequentially performed.

(Supplementary Note 10)
According to another aspect of the present invention, there is provided a semiconductor device manufacturing method of forming a film of less than one atomic layer on a substrate, the method including: (a) supplying a source gas into a processing chamber accommodating the substrate to adsorb the source gas on the substrate; (b) supplying a reactive gas different from the source gas into the processing chamber to cause a reaction of the reactive gas with the source gas adsorbed on the substrate before the source gas is saturatively adsorbed on the substrate; (c) removing an inner atmosphere of the processing chamber; and (d) supplying a modifying gas for modifying the source gas into the processing chamber while heating the substrate at a second temperature higher than the first temperature to modify the source gas adsorbed on the substrate.

(Supplementary Note 11)

Preferably, the film of less than one atomic layer is formed on the substrate by exploiting the fact that a growth rate of the film has a point of inflection.

(Supplementary Note 12)

A semiconductor device manufactured using one of the methods of manufacturing a semiconductor device described in Supplementary Notes 1 through 11 is provided.

(Supplementary Note 13)

According to another aspect of the present invention, there is provided a substrate processing apparatus including: a processing chamber configured to accommodate a substrate; a source gas supply system configured to supply a source gas into the processing chamber; a reactive gas supply system configured to supply a reactive gas different from the source gas into the processing chamber; a modifying gas supply system configured to supply a modifying gas into the processing chamber; an exhaust system configured to exhaust an inside of the processing chamber; and a controller configured to control the source gas supply system, the reactive gas supply system, the modifying gas supply system and the exhaust system such that a film of less than one atomic layer is formed on the substrate by performing a process including: (a) supplying the source gas into the processing chamber accommodating the substrate to adsorb the source gas on the substrate; (b) supplying the reactive gas into the processing chamber to cause a reaction of the reactive gas with the source gas adsorbed on the substrate before the source gas is saturatively adsorbed on the substrate; (c) removing an inner atmosphere of the processing chamber; and (d) supplying the modifying gas into the processing chamber to modify the source gas adsorbed on the substrate, the source gas being reacted with the reactive gas.

What is claimed is:

1. A semiconductor device manufacturing method comprising:
    (a) supplying a source gas containing a first element and chlorine to a substrate accommodated in a processing chamber to form an adsorption layer of the source gas on the substrate;
    (b) supplying a chlorine-containing gas having a composition different from that of the source gas to the substrate while supplying the source gas before the adsorption of the source gas on the substrate is saturated to suppress the adsorption of the source gas on the substrate;
    (c) removing the source gas and the chlorine-containing gas remaining on the substrate;
    (d) supplying a modifying gas including a second element to the substrate to form a layer comprising the first element and the second element on the substrate by modifying the adsorption layer of the source gas; and
    (e) removing the modifying gas remaining on the substrate.

2. A semiconductor device manufacturing method comprising:
    (a) supplying a source gas containing a first element and chlorine to a substrate accommodated in a processing chamber to form an adsorption layer of the source gas on the substrate;
    (b) supplying a chlorine-containing having a composition different from that of the source gas to the substrate while supplying the source gas before the adsorption of the source gas on the substrate is saturated to suppress the adsorption of the source gas on the substrate;
    (c) removing the source gas and the chlorine-containing gas remaining on the substrate;
    (d) supplying a modifying gas including a second element to the substrate to form a layer comprising the first element and the second element on the substrate by modifying the adsorption layer of the source gas;
    (e) removing the modifying gas remaining on the substrate; and
    (f) supplying the modifying gas activated by applying light or plasma to desorb the chlorine-containing gas remaining on the layer comprising the first element and the second element formed on the substrate.

3. A semiconductor device manufacturing method comprising:
    (a) supplying a source gas containing a first element and chlorine to a substrate accommodated in a processing chamber while heating the substrate to be at a first temperature to form an adsorption layer of the source gas on the substrate;
    (b) supplying a chlorine-containing gas having a composition different from that of the source gas to the substrate while supplying the source gas before the adsorption of the source gas on the substrate is saturated to suppress the adsorption of the source gas on the substrate;
    (c) removing the source gas and the chlorine-containing gas remaining on the substrate;
    (d) supplying a modifying gas including a second element to the substrate while heating the substrate to be at a second temperature higher than the first temperature to form a layer comprising the first element and the second element on the substrate by modifying the adsorption layer of the source gas; and
    (e) removing the modifying gas remaining on the substrate.

4. The method of claim 1, wherein the layer comprising the first element and the second element is of less than one atomic layer, and is formed on the substrate in (d) by controlling a growth rate of the layer comprising the first element and the second element to have a point of inflection.

5. The method of claim 1, wherein the modifying gas comprises a nitridation source.

6. The method of claim 1, wherein the chlorine-containing gas comprises hydrogen chloride gas or chlorine gas.

7. The method of claim 6, wherein the chlorine-containing gas comprises hydrogen chloride gas.

8. A substrate processing apparatus comprising:
    a processing chamber configured to accommodate a substrate;
    a source gas supply system configured to supply a source gas containing a first element and chlorine to the substrate;
    a chlorine-containing gas supply system configured to supply a chlorine-containing gas having a composition different from that of the source gas to the substrate;
    a modifying gas supply system configured to supply a modifying gas containing a second element to the substrate;
    an exhaust system configured to exhaust gases remaining on the substrate; and
    a controller configured to control the source gas supply system, the chlorine-containing gas supply system, the modifying gas supply system and the exhaust system to perform: (a) supplying the source gas containing the first element and chlorine to the substrate accommodated in the processing chamber to form an adsorption layer of the source gas on the substrate; (b) supplying the chlorine-containing gas having the composition different from that of the source gas to the substrate while supplying the source gas before the adsorption of the source gas on the substrate is saturated to suppress the adsorption of the source gas on the substrate; (c) removing the source gas and the chlorine-containing gas remaining on the substrate; (d) supplying the modifying gas including the second element to the substrate to form a layer comprising the first element and the second element on the substrate by modifying the adsorption layer of the source gas; and (e) removing the modifying gas remaining on the substrate.

9. A substrate processing apparatus comprising:

a processing chamber configured to accommodate a substrate;

a source gas supply system configured to supply a source gas containing a first element and chlorine to the substrate;

a chlorine-containing gas supply system configured to supply a chlorine-containing gas having a composition different from that of the source gas to the substrate;

a modifying gas supply system configured to supply a modifying gas containing a second element to the substrate;

an exhaust system configured to exhaust gases remaining on the substrate; and a controller configured to control the source gas supply system, the chlorine-containing gas supply system, the modifying gas supply system and the exhaust system to perform: (a) supplying the source gas containing the first element and chlorine to the substrate accommodated in the processing chamber to form an adsorption layer of the source gas on the substrate; (b) supplying the chlorine-containing gas having the composition different from that of the source gas to the substrate while supplying the source gas before the adsorption of the source gas on the substrate is saturated to suppress the adsorption of the source gas on the substrate; (c) removing the source gas and the chlorine-containing gas remaining on the substrate; (d) supplying the modifying gas including the second element to the substrate to form a layer comprising the first element and the second element on the substrate by modifying the adsorption layer of the source gas; (e) removing the modifying gas remaining on the substrate; and (f) supplying the modifying gas activated by applying light or plasma to desorb the chlorine-containing gas remaining on the layer comprising the first element and the second element formed on the substrate.

10. A substrate processing apparatus comprising:

a processing chamber configured to accommodate a substrate;

a source gas supply system configured to supply a source gas containing a first element and chlorine to the substrate;

a chlorine-containing gas supply system configured to supply a chlorine-containing gas having a composition different from that of the source gas to the substrate;

a modifying gas supply system configured to supply a modifying gas containing a second element to the substrate;

an exhaust system configured to exhaust gases remaining on the substrate; and a controller configured to control the source gas supply system, the chlorine-containing gas supply system, the modifying gas supply system and the exhaust system to perform: (a) supplying the source gas containing the first element and chlorine to the substrate accommodated in the processing chamber while heating the substrate to be at a first temperature to form an adsorption layer of the source gas on the substrate; (b) supplying the chlorine-containing gas having the composition different from that of the source gas to the substrate while supplying the source gas before the adsorption of the source gas on the substrate is saturated to suppress the adsorption of the source gas on the substrate; (c) removing the source gas and the chlorine-containing gas remaining on the substrate; (d) supplying the modifying gas including the second element to the substrate while heating the substrate to be at a second temperature higher than the first temperature to form a layer comprising the first element and the second element on the substrate by modifying the adsorption layer of the source gas; and (e) removing the modifying gas remaining on the substrate.

11. The method of claim 2, wherein the layer comprising the first element and the second element is of less than one atomic layer, and is formed on the substrate in (d) by controlling a growth rate of the layer comprising the first element and the second element to have a point of inflection.

12. The method of claim 2, wherein the modifying gas comprises a nitridation source.

13. The method of claim 2, wherein the chlorine-containing gas comprises hydrogen chloride gas or chlorine gas.

14. The method of claim 3, wherein the layer comprising the first element and the second element is of less than one atomic layer, and is formed on the substrate in (d) by controlling a growth rate of the layer comprising the first element and the second element to have a point of inflection.

15. The method of claim 3, wherein the modifying gas comprises a nitridation source.

16. The method of claim 3, wherein the chlorine-containing gas comprises hydrogen chloride gas or chlorine gas.

* * * * *